United States Patent
Guo

(10) Patent No.: US 9,461,243 B2
(45) Date of Patent: Oct. 4, 2016

(54) STT-MRAM AND METHOD OF MANUFACTURING THE SAME

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

(21) Appl. No.: 14/147,493

(22) Filed: Jan. 3, 2014

(65) Prior Publication Data

US 2014/0217487 A1 Aug. 7, 2014

Related U.S. Application Data

(60) Provisional application No. 61/749,256, filed on Jan. 5, 2013.

(51) Int. Cl.
| | |
|---|---|
| *H01L 43/02* | (2006.01) |
| *H01L 43/12* | (2006.01) |
| *H01L 21/033* | (2006.01) |
| *H01L 21/64* | (2006.01) |
| *G11C 11/16* | (2006.01) |
| *H01L 43/08* | (2006.01) |
| *H01L 27/22* | (2006.01) |

(52) U.S. Cl.
CPC ............. *H01L 43/12* (2013.01); *G11C 11/161* (2013.01); *H01L 27/228* (2013.01); *H01L 43/08* (2013.01)

(58) Field of Classification Search
None
See application file for complete search history.

(56) References Cited

U.S. PATENT DOCUMENTS

| | | | |
|---|---|---|---|
| 8,406,045 B1* | 3/2013 | Chen et al. | 365/173 |
| 2009/0268352 A1* | 10/2009 | Wang et al. | 360/324.12 |
| 2013/0161770 A1* | 6/2013 | Meng et al. | 257/421 |
| 2014/0124882 A1* | 5/2014 | Khalili Amiri et al. | 257/421 |

* cited by examiner

*Primary Examiner* — Joseph Schoenholtz
(74) *Attorney, Agent, or Firm* — 5Suns; Yuanhui Huang

(57) ABSTRACT

A planar STT-MRAM comprises apparatus, a method of operating a spin-torque magnetoresistive memory and a plurality of magnetoresistive memory element having spin-transfer torques acting on a recording layer from a MTJ stack and a novel magnetoresistance with a spin-valve layer. The spin-valve layer is field-reversible between two stable magnetization states either parallel or anti-parallel to the fixed reference layer magnetization through a set/reset current pulse along a conductive line provided by a control circuitry, accordingly, the magnetoresistive element is pre-configured into a reading mode having canceled spin-transfer torques or a recording mode having additive spin-transfer torques.

17 Claims, 7 Drawing Sheets

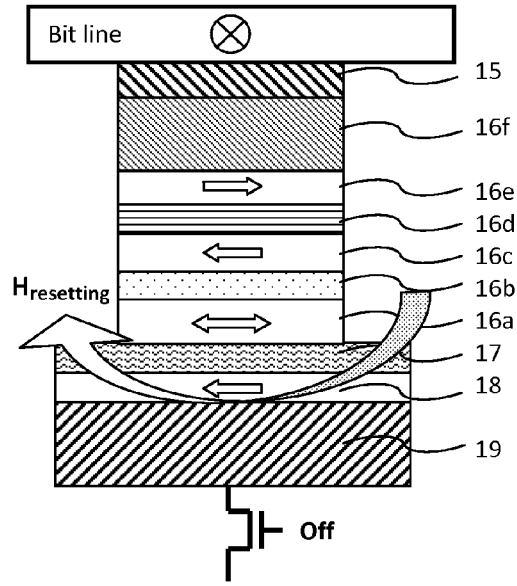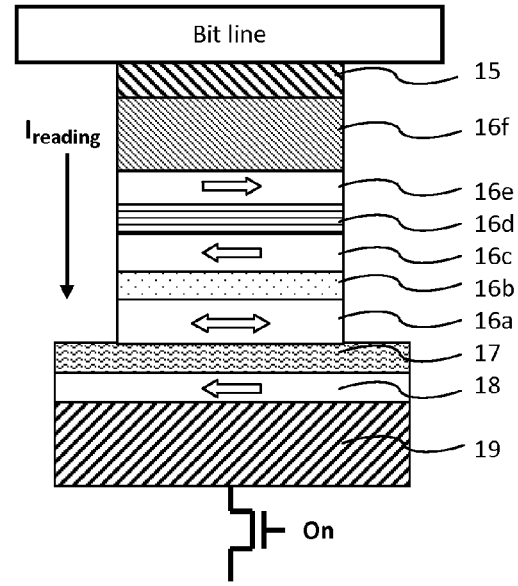
Figure 3A
Figure 3B
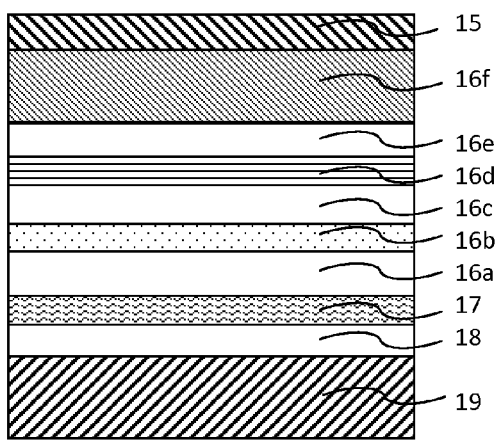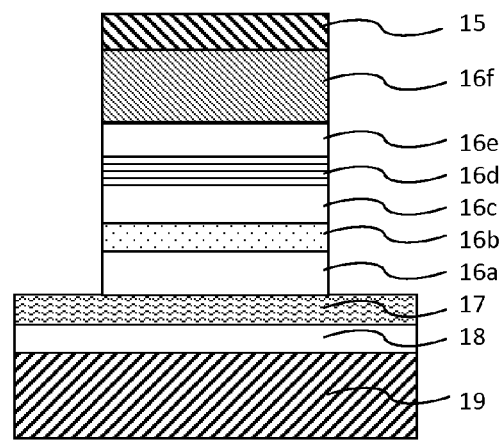
Figure 4
Figure 5

STT-MRAM AND METHOD OF MANUFACTURING THE SAME

RELATED APPLICATIONS

This application claims the priority benefit of U.S. Provisional Application No. 61/749,256, filed on Jan. 5, 2013, which is incorporated herein by reference.

BACKGROUND OF THE INVENTION

1. Field of the Invention

This invention relates generally to a spin-transfer-torque magnetic-random-access memory (MRAM) and a method of manufacturing the same using magnetoresistive elements as basic memory cells, more particularly to structures and methods of reading and programming a spin-torque magnetoresistive random access memory (MRAM) having a field-control spin-valve capability.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. Accordingly, this method is expected to be capable of achieving both device miniaturization and lower currents. In another word, STT-MRAM having high speed, large capacities and low-power-consumption operations can potentially replace the conventional semiconductor memory used in electronic chips, especially mobile chips for power saving and non-volatility.

In a simple configuration, the so-called planar STT-MRAM, the recording layer of each MTJ element is designed to have stable magnetic states with magnetization in the film plane. In-plane devices typically have their magnetic easy axis defined by the in-plane shape of the free layer, or the shape anisotropy. To record information or change resistance state, a recording current is provided by its CMOS transistor to flow in the stacked direction of the magnetoresistive element. Generally, constant-voltage recording is used when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become non-functional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to find out whether the MTJ element states are at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

Thus, it is desirable to provide STT-MRAM structures and methods that realize both highly-accurate reading and highly-reliable recording while suppressing destruction and reduction of life of MTJ memory device due to recording in a nonvolatile memory that performs recording resistance changes.

BRIEF SUMMARY OF THE PRESENT INVENTION

The present invention comprises apparatus and a method provided for programming, recording and reading in a planar STT-MRAM. A plurality of magnetoresistive memory element in a planar STT-MRAM comprises: a recording layer having magnetic anisotropy in a film surface and having a variable magnetization direction; a reference layer having magnetic anisotropy in a film surface and having an invariable magnetization direction; a tunnel barrier layer provided between the recording layer and the reference layer; an intermediate layer provided on a surface of the recording layer, which is opposite to a surface of the recording layer where the tunnel barrier layer is provided; a spin-valve layer provided on a surface of the intermediate layer having magnetic anisotropy in a film plane and having a variable magnetization direction. An upper electrode and a bottom electrode sandwich a magnetoresistive memory element, wherein a bit line coupled to the plurality of magnetoresistive memory elements through the upper electrode and a CMOS transistor coupled the plurality of magnetoresistive memory elements through the bottom electrode.

An exemplary embodiment includes method of operating a spin-torque magnetoresistive memory including a circuitry coupled to the bit line positioned adjacent to the selected ones of the plurality of magnetoresistive memory elements and configured to set the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current pulse of predetermined magnitude, duration, and direction flows along the bit line, and to reset the spin-valve layer to a second known magnetic state having a magnetization parallel to the invariable magnetization direction of the reference layer by a magnetic resetting field with a predominant component parallel to the invariable magnetization direction of the reference layer when are setting electrical current pulse of predetermined magnitude, duration, and direction flows along the bit line. After each setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer. After each resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancel or partially cancel.

Another exemplary embodiment includes method of operating a spin-torque magnetoresistive memory including a circuitry coupled to a conductive set/reset line positioned adjacent to the selected ones of the plurality of magnetoresistive memory elements and configured to set the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current pulse of predetermined magnitude, duration, and direction flows along the conductive set/reset line, and to reset the spin-valve layer to a second known magnetic state having a magnetization parallel to the invariable magnetization direction of the reference layer by a magnetic resetting field with a predominant component parallel to the invariable magnetization direction of the reference layer when are setting electrical current pulse of predetermined magnitude, duration, and direction flows along the conductive set/reset line. After each setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer. After each resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancels or partially cancels.

Various embodiments will be described hereinafter with reference to the accompanying drawings. The drawings are schematic or conceptual, and the relationships between the thickness and width of portions, the proportional coefficients of sizes among portions, etc., are not necessarily the same as the actual values thereof.

BRIEF DESCRIPTION OF THE DRAWINGS

FIG. 3A illustrates a memory element having a bit line resetting current pulse generated field to set the spin-valve layer magnetization parallel to the reference layer magnetization, according to the first embodiment;

FIG. 3B illustrates a memory element in a reading mode after applying a bit line resetting current pulse. The MTJ resistance state is only read-out by a reading current through the bit line into the stacked body along the stack direction;

FIG. 4 is a cross-sectional view illustrating a manufacturing method according to the first embodiment;

FIG. 5 is a cross-sectional view illustrating a manufacturing method according to the first embodiment;

DETAILED DESCRIPTION OF THE INVENTION

Figure 1:
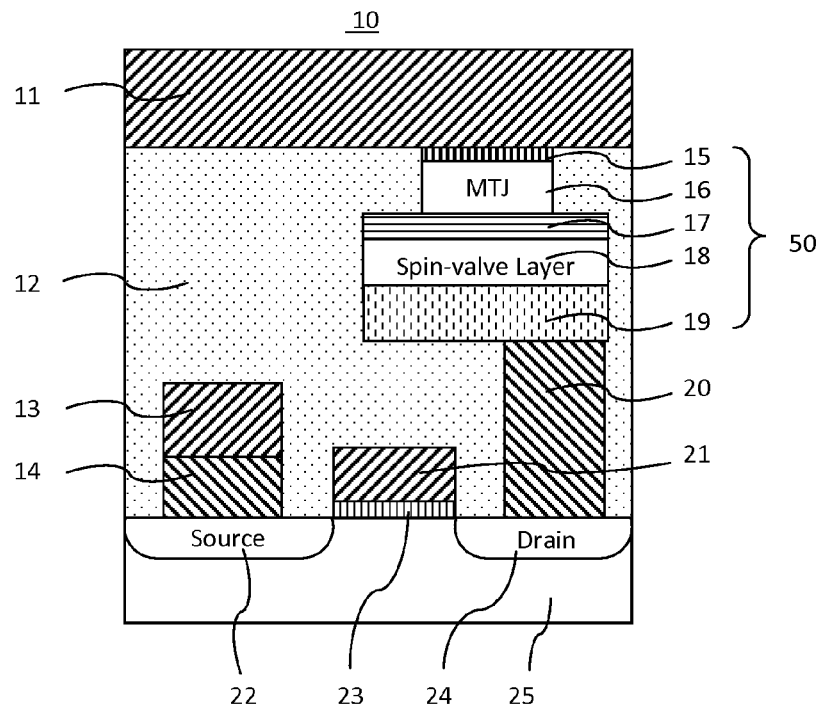
FIG. 1 is an exemplary cross-section of one memory cell in a planar STT-MRAM array according to the first embodiment.

In general, according to each embodiment, there is provided a magnetoresistive element comprising:

a recording layer having magnetic anisotropy in a film surface and having a variable magnetization direction;

a reference layer having magnetic anisotropy in a film surface and having an invariable magnetization direction;

a tunnel barrier layer provided between the recording layer and the reference layer;

an intermediate layer provided on a surface of the recording layer, which is opposite to a surface of the recording layer where the tunnel barrier layer is provided;

a spin-valve layer provided on a surface of the intermediate layer having magnetic anisotropy in a film plane and having a variable magnetization direction;

an upper electrode provided as the top electric connecting layer of the magnetoresistive element;

and a bottom electrode provided as the bottom electric connecting layer of the magnetoresistive element.

In each embodiment, there is also provided a magnetoresistive memory cell comprising a magnetoresistive element and further comprising:

a bit line coupled to the plurality of magnetoresistive memory elements through the upper electrode;

and a CMOS transistor coupled the plurality of magnetoresistive memory elements through the bottom electrode.

An exemplary embodiment further includes method of operating a spin-transfer torque magnetoresistive memory including a circuitry coupled to the bit line positioned adjacent to selected ones of the plurality of magnetoresistive memory elements and configured to either of two set/reset modes thereafter:

setting the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current pulse of predetermined magnitude, duration, and direction flows along the bit line;

and resetting the spin-valve layer to a second known magnetic state having a magnetization parallel to the invariable magnetization direction of the reference layer by a magnetic resetting field with a predominant component parallel to the invariable magnetization direction of the reference layer when a resetting electrical current pulse of predetermined magnitude, duration, and direction flows along the bit line.

After setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer.

After resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancel or partially cancel.

Another exemplary embodiment further includes method of operating a spin-transfer torque magnetoresistive memory including a circuitry coupled to a conductive set/reset line positioned adjacent to selected ones of the plurality of magnetoresistive memory elements and configured to either of two set/reset modes thereafter:

setting the spin-valve layer to a first known magnetic state having a magnetization anti-parallel to the invariable magnetization direction of the reference layer by a magnetic setting field with a predominant component anti-parallel to the invariable magnetization direction of the reference layer when a setting electrical current of predetermined magnitude, duration, and direction flows along the conductive set/reset line;

and resetting the spin-valve layer to a second known magnetic state having a magnetization parallel to the invariable magnetization direction of the reference layer by a magnetic resetting field with a predominant component parallel to the invariable magnetization direction of the reference layer when a resetting electrical current of predetermined magnitude, duration, and direction flows along the conductive set/reset.

After setting the spin-valve layer to the first magnetic state, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer.

After resetting the spin-valve layer to the second magnetic state, the magnetization of the recording layer becomes un-configurable, or un-switchable to a reading current through the bit line into the stacked body along the stack direction, since the reference layer and spin-valve layer have parallel magnetizations on the opposite sides of the recording layer and accordingly spin-transfer torques cancel or partially cancel.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

First Embodiment

FIG. 1 is an exemplary cross-section of a magnetoresistive memory cell 10 in a planar STT-MRAM array according to the first embodiment. The magnetoresistive memory cell 10 is configured by a bit line 11, a dielectric interlayer 12, a magnetoresistive element 50 and a select transistor comprising an interconnect layer 13, a source contact 14, a drain contact 20, a gate electrode 21, a source region 22, a gate insulating film 23, a drain region 24 and a substrate 25. The magnetoresistive element 50 comprises: an upper electrode 15, an MTJ stack 16, an intermediate layer 17, a spin-valve layer 18 and a bottom electrode 19.

Figures 2A, 2B:
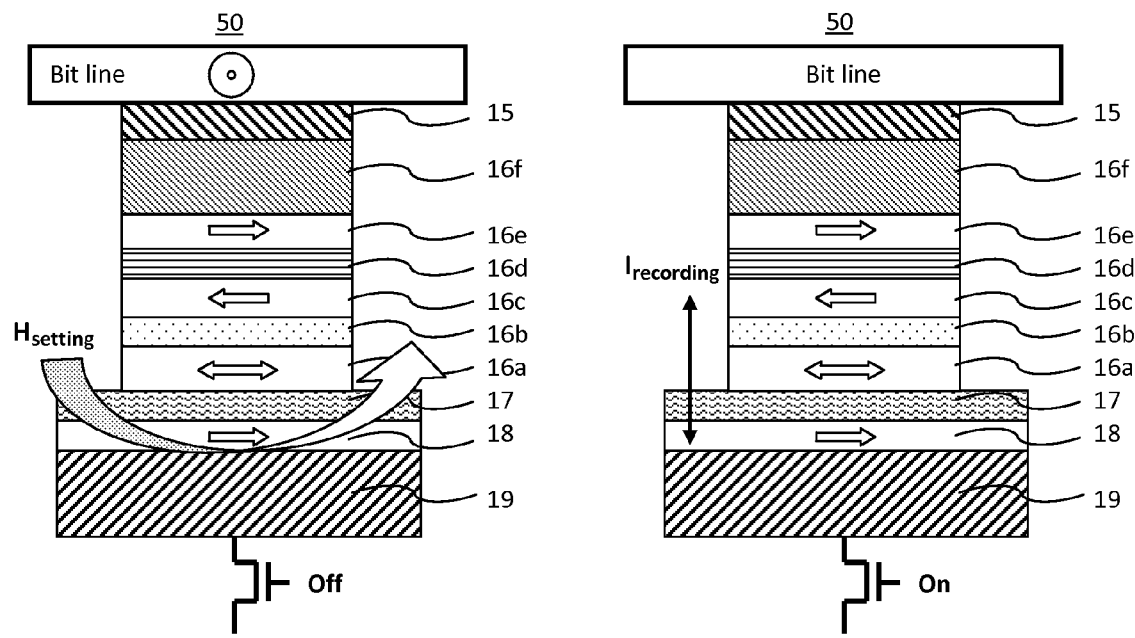
FIG. 2A illustrates a memory element having a bit line setting current pulse generated field to set the spin-valve layer magnetization anti-parallel to the reference layer magnetization, according to the first embodiment.
FIG. 2B illustrates a memory element in a recording mode after applying a bit line setting current pulse. The magnetization of the recording layer is switchable to the direction in accordance with a direction of a recording spin-transfer current through the bit line into the stacked body along the stack direction by a dual spin-transfer torque from the reference layer and the spin-valve layer.

FIG. 2A illustrates a magnetoresistive element 50 setting into a recording mode by applying a bit line setting current pulse, according to the first embodiment. The magnetoresistive element 50 comprises: an upper electrode 15, an antiferromagnetic pinning layer 16f, a pinned ferromagnetic layer 16e, a coupling spacing layer 16d, a reference layer 16c, a tunnel barrier 16b, a recording layer 16a, an intermediate layer 17, a spin-valve layer 18 and a bottom electrode 19, in the order from the top. Among them, the multi-layered structure from 16a to 16f forms a MTJ stack.

The antiferromagnetic pinning layer 16f is above and in contact with the pinned ferromagnetic layer 16e. The ferromagnetic reference and pinned layers (16c, 16e) each have a magnetic moment vector that are usually held anti-parallel by the coupling spacer layer 16d and held in a fixed direction by the antiferromagnetic pinning layer. Thus the magnetic moment vector of fixed reference layer 16c is not free to rotate and is used as a reference. The coupling layer is typically one that exhibits the oscillatory coupling phenomenon, for example, at least one of the elements Ru, Os, Re, Cr, Rh, Cu, or their combinations, with a thickness chosen for strong anti-parallel coupling. The antiferromagnetic pinning layer, may comprise materials such as PtMn, IrMn, PdMn, or combinations thereof.

The recording layer 16a has a variable (reversible) magnetization having a uni-axial anisotropy parallel to the fixed magnetization of the reference layer. In another word, the MTJ stack is either at its parallel state (or the low resistance state) or anti-parallel state (or the high resistance) where no external magnetic field exists and no spin-transfer current is applied.

The spin-valve layer is made of ferromagnetic material, and has a variable (reversible) magnetization having an uniaxial anisotropy parallel to the fixed magnetization of the reference layer. The anisotropy of the spin-valve layer is smaller than that of the recording layer, which can be achieved by selecting a material having low Hc and near-zero magnetostriction and larger dimensions in the film plane, accordingly, its magnetization is readily field-switched by the bit line set/reset current pulse.

A permeable ferromagnetic material, also known also as a cladding material, may be positioned on a top portion of the bit line to focus the magnetic field on its underneath spin-valve layer. Further, the spin-valve layer easy axis may be oriented at an angle in the range of about 20 degrees to 45 degrees from the fixed magnetization direction of the reference. In a preferred embodiment of the invention, the free layer easy axis is oriented at an angle of about 90 degrees from the direction of the magnetic field generated by the bit line set/reset current pulse. It can be easily shown that for a typical free layer having a Stoner-Wohlfarth-like switching asteroid, the switching field is reduced by a factor of 2 if the field is applied at 45 degrees from the easy axis of the bit. Therefore, the current needed to set or reset the spin-valve layer magnetization direction is also reduced by a factor of 2, making the set/reset require less power, while the magnetic vector of the free layer is un-switched in the present of the bit line set/reset current.

The intermediate layer 17 in FIG. 2 is made of a thin metal oxide, such as MgO, or the nonmagnetic metal, such as Cu, forming a thin tunneling magnetoresistance or giant magnetoresistance between the recording layer and the spin-valve layer. Accordingly, the recording layer magnetization experiences spin-transfer torques from both the reference layer and the spin-valve layer. Further, its magnetoresistance is made much smaller than that of the MTJ, yielding negligible effect on the reading signals.

The magnetic field generated by a setting current pulse along the bit line switches the spin-valve layer magnetization anti-parallel to the fixed magnetization of the reference layer. Since the shape anisotropy of the spin-valve layer is made much smaller than that of the recording layer, the setting field readily switches the spin-valve layer magnetization while the recording layer magnetization keeps unchanged. It is achieved by selecting the spin-valve layer having a near-zero magnetostriction material, a larger dimensions/volume. The spin-valve layer is readily switched by a field from bit line set/reset current due to its smaller anisotropy than the recording layer, but the much larger size provides an enough anisotropy energy as well as high thermal stability factor.

FIG. 2B illustrates a magnetoresistive element 50 in a recording process having a spin-transfer current flowing between the bit line and the transistor, according to the first embodiment. Once a bit-line setting current pulse is applied, the magnetoresistive element is set in a recording mode, as shown FIG. 2B, the spin-valve layer has a magnetization anti-parallel to the magnetization direction of the reference layer, the magnetization of the recording layer is configurable, or switchable, to the direction in accordance with a direction of a recording current through the bit line into the stacked body along the stack direction to act on the recording layer. Since the magnetization directions between the spin-valve layer and the reference layer are anti-parallel, the spin transfer torques from both of them are additive, yielding a lower switching current. Thus, the recording current voltage is reduced and a larger margin between breakdown and switching voltages is obtained.

FIG. 3A illustrates a magnetoresistive element 50 having been reset into a reading mode by applying a bit line resetting current pulse, according to the first embodiment. The field generated by the bit line resetting current switches the spin-valve layer magnetization parallel to the fixed magnetization of the reference layer and the spin-valve layer. After a bit line resetting current pulse is applied, magnetoresistive element is set in a reading mode, as shown FIG. 3B, the magnetization of the recording layer becomes un-configurable, or un-switchable to a reading current through the bit line into the stacked body along the stack direction, due to a cancellation or partially cancellation of the two spin-transfer torques. Accordingly, the reading current voltage causes no unintended switching.

During fabrication of the MRAM array architecture, each succeeding layer is deposited or otherwise formed in sequence and each magnetoresistive element may be defined by selective deposition, photolithography processing, etching, etc. using any of the techniques known in the semiconductor industry. Typically the layers of the MTJ stack are formed by thin-film deposition techniques such as physical vapor deposition, including magnetron sputtering and ion beam deposition, or thermal evaporation. During deposition of at least a portion of the magnetoresistive element, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element.

Referring now to FIGS. 4 through 9, a method of manufacturing a magnetoresistive element in an MRAM array according to the first embodiment is described. The magnetoresistive element to be manufactured by the manufacturing method according to this embodiment is the magnetoresistive element 10 of the first embodiment of FIG. 1.

First, as shown in FIG. 4, a magnetoresistive element including the bottom electrode 19, the spin-valve layer 18, the intermediate layer 17, recording layer 16a, the tunnel barrier layer 16b, the reference layer 16c, the coupling spacing layer 16d, the pinned layer 16e, the antiferromagnetic layer 16f, and the hard mask layer 15 serving as the upper electrode are then sequentially formed to cover the contact 20 (see FIG. 1) by a sputtering technique, for example. The bottom electrode 19 is a necessary base layer for connecting to the contact 20 and growing flat magnetic layers having good magnetization and high magnetoresistive ratio. Examples of the materials of the spin-valve layer 18, the recording layer 16a and reference layer 16c are materials made of ferromagnetic material alloy consisting at least one element from Co, Fe, Ni and B. The intermediate layer may be a nonmagnetic layer made of Cu, Ag, Au, or a thin metal oxide such as MgO, etc. The tunnel barrier layer 16b may be a magnesium oxide (MgO) layer, for example. The hard mask layer 15 may be a tantalum (Ta) layer, for example.

An MTJ stack patterning is then performed by using a known lithography technique or a known etching technique. A mask (not shown) made of a photoresist is formed on the hard mask layer 15. Using the mask, patterning is performed on the hard mask layer 15 and down to a top surface of the intermediate layer 17 by anisotropic etching such as reactive ion etching (RIE), as shown in FIG. 5. Since possible re-deposition of metal atoms on the MTJ side wall could be formed, it's preferred to conduct a sputter etching at varied angle to remove these materials from tunnel barrier layer edges. It should be noted that any residual material from the recording layer may be further oxidized to avoid possible current crowding induced MTJ resistance variation. An optional process includes O ion or N ion implantation into the etched surface.

Figure 6:
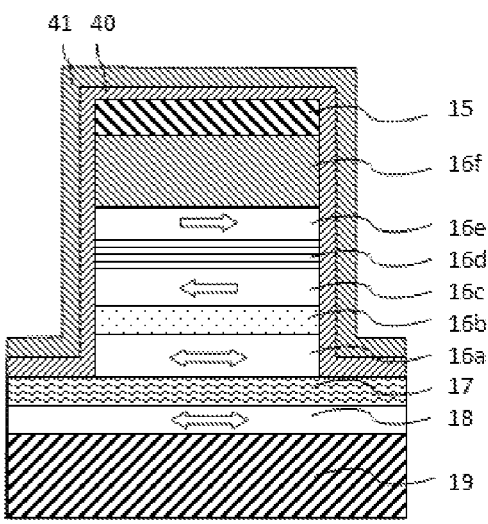
FIG. 6 is a cross-sectional view illustrating a manufacturing method according to the first embodiment.
Figure 7:
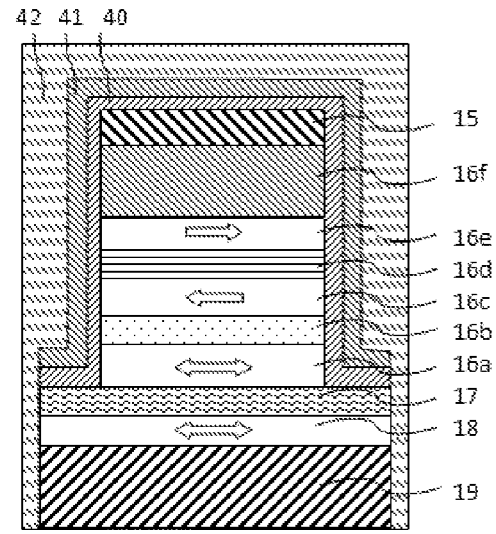
FIG. 7 is a cross-sectional view illustrating a manufacturing method according to the first embodiment.

A thin insulating film 40 is then formed to conformally cover the surface of the patterned film. After the insulating film 40 is formed, an interlayer insulating film 41 made of silicon oxide ($SiO_2$) or silicon nitride (SiN), for example, is deposited on the entire surface, as shown in FIG. 6. A mask (not shown) made of a photoresist, for example, is formed on the top surface of the interlayer insulating film 41, to electrically separates the magnetoresistive element 10 from the adjacent memory cells. Using this mask, patterning is performed on the intermediate layer 17, the spin-valve layer 18 and the bottom electrode 19 by anisotropy etching. After that, an interlayer insulating film 42 is deposited to cover the interlayer insulating film 41, the insulating film 40, the bottom electrode 19, the seed layer 18 which have been subjected to the patterning, as shown in FIG. 7.

Figure 8:
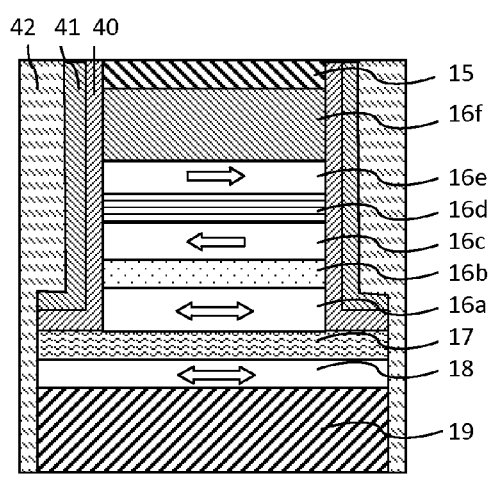
FIG. 8 is a cross-sectional view illustrating a manufacturing method according to the first embodiment.

The interlayer insulating film 42 is then flattened by CMP. Further, the interlayer insulating film 42, the interlayer insulating film 41, and the insulating film 40 are also trimmed, to expose the upper face of the hard mask layer 15 on the MTJ film, as shown in FIG. 8.

Figure 9:
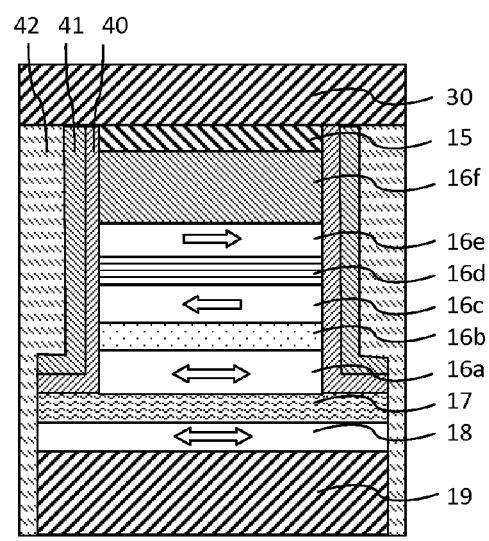
FIG. 9 is a cross-sectional view illustrating a manufacturing method according to the first embodiment.

As shown in FIG. 9, a bit line 30 to be electrically connected to the hard mask layer 15 is formed on the magnetoresistive element 10. The bit line 30 may be made of aluminum (Al) or copper (Cu), for example. Thus, a memory cell of the MRAM of the first embodiment is formed by the manufacturing method according to this embodiment.

In the MRAM manufactured by the manufacturing method according to this embodiment, the spin transfer switching characteristics of magnetoresistive elements used in memory cells can be improved due to a dual spin transfer torque effect. Further, the magnetoresistive elements are manufactured with a high yield as a separated programming between recording and reading enables enhanced margins among reading, recording and breakdown voltages. Accordingly, MRAMs manufactured by the manufacturing method according to this embodiment have high productivity.

According to this embodiment, an MRAM can be formed by using magnetoresistive elements according to one of the first embodiment and its modifications.

Figure 10:
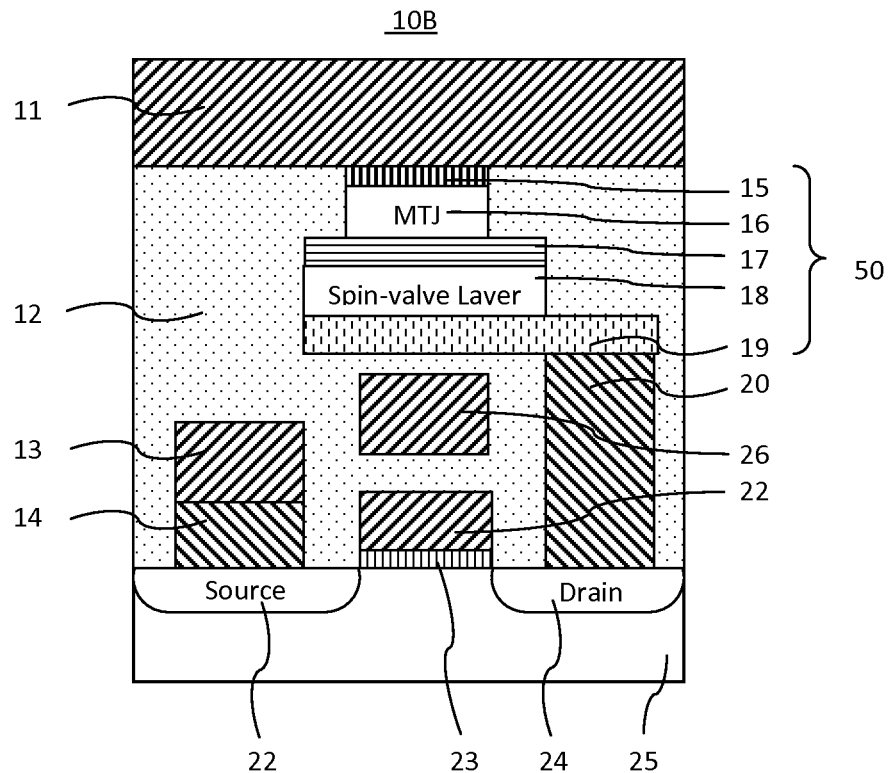
FIG. 10 is an exemplary cross-section of one memory cell in a planar STT-MRAM array according to a first modification of the first embodiment.

FIG. 10 shows a memory cell according to a first modification of the first embodiment. The magnetoresistive element 10B according to the second modification is the same as the magnetoresistive element 10 of the first embodiment shown in FIG. 1, except that an additional conductive set/reset layer 26 is provided.

Figure 11:
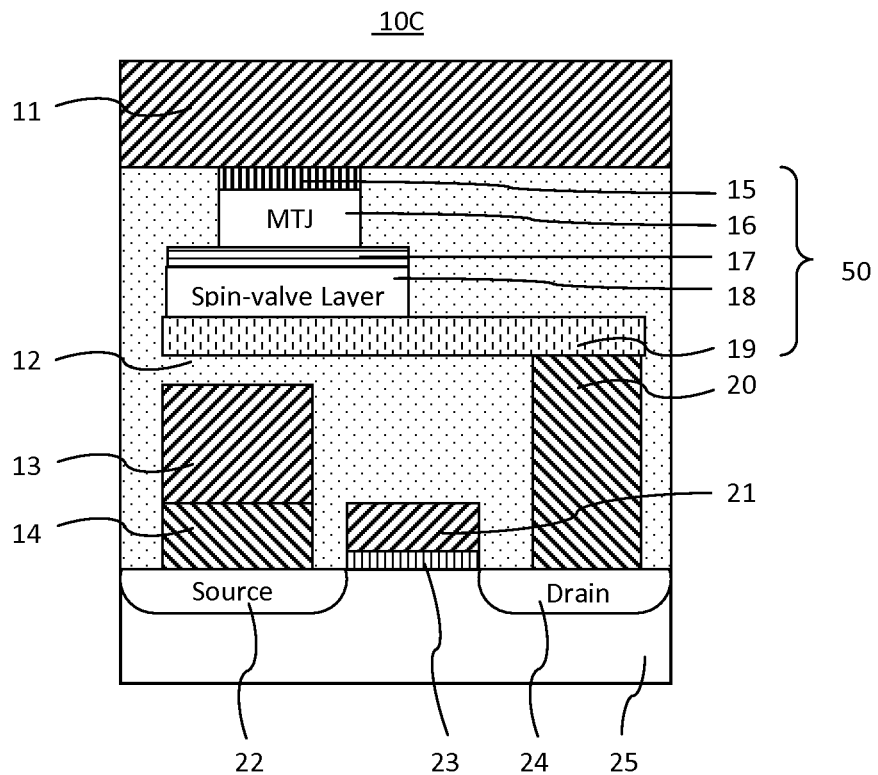
FIG. 11 is an exemplary cross-section of one memory cell in a planar STT-MRAM array according to a second modification of the first embodiment.

FIG. 11 shows a memory cell according to a second modification of the first embodiment. The magnetoresistive element 10C according to the second modification is the same as the magnetoresistive element 10 of the first embodiment shown in FIG. 1, except that the interconnect layer 13 serving as setting/resetting function instead of bit line setting/resetting.

Second Embodiment

Referring now to FIGS. 12-20), a magnetoresistive memory cell according to a second embodiment is described.

Figure 12:
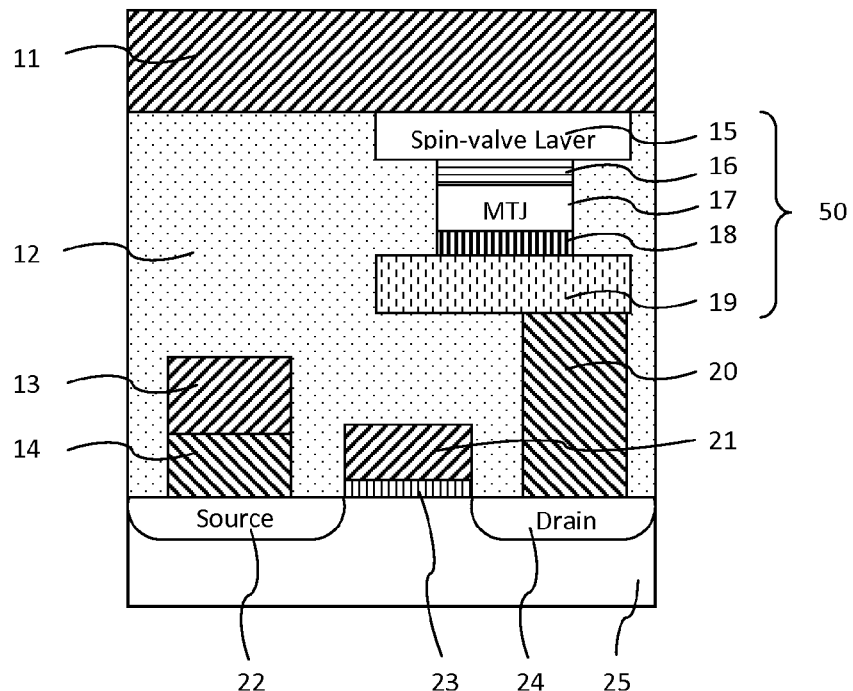
FIG. 12 is an exemplary cross-section of one memory cell in a planar STT-MRAM array according to the second embodiment.

FIG. 12 is an exemplary cross-section of a magnetoresistive memory cell 10 in a planar STT-MRAM array according to the second embodiment. The magnetoresistive memory cell 10 is configured by a bit line 11, a dielectric interlayer 12, a magnetoresistive element 50 and a select transistor comprising an interconnect layer 13, a source contact 14, a drain contact 20, a gate electrode 21, a source region 22, a gate insulating film 23, a drain region 24 and a substrate 25. The magnetoresistive element 50 comprises: a spin-valve layer 15, an intermediate layer 16, an MTJ stack 17, a seed layer 18 and a bottom electrode 19.

Figures 13A, 13B:
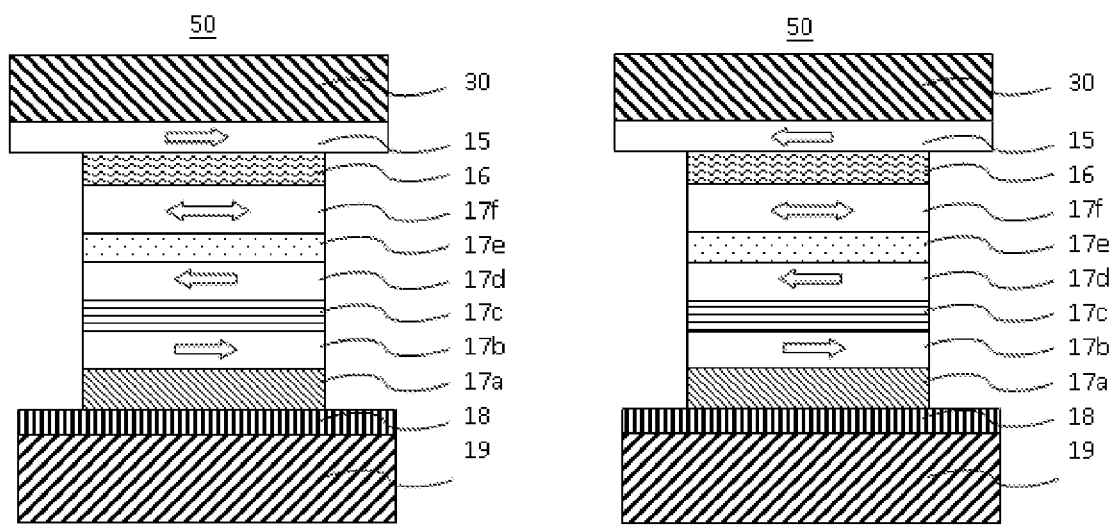
FIG. 13A illustrates a memory cell in a recording mode having anti-parallel magnetization states between the reference layer and the spin-valve layer after bit line current setting, according to the second embodiment.
FIG. 13B illustrates a memory cell in a reading mode having parallel magnetization states between the reference layer and the spin-valve layer after bit line current resetting, according to the second embodiment.

The shape anisotropy of the spin-valve layer is along the same direction of the recording layer, but is much smaller than that of the recording layer so that the setting field readily switches the spin-valve layer magnetization while leaving the recording layer magnetization unchanged. It is achieved by selecting the spin-valve layer having a near-zero magnetostriction material, a larger dimensions/volume. The spin-valve layer is readily switched by a field from bit line set/reset current due to its smaller anisotropy than the recording layer, but the much larger size provides an enough anisotropy energy as well as high thermal stability factor. FIG. 13A illustrates a magnetoresistive element 50 setting into a recording mode by applying a bit line setting current pulse, according to the second embodiment. The field generated by the bit line setting current switches the spin-valve layer magnetization anti-parallel to the fixed magnetization of the reference layer and the spin-valve layer, accordingly, the spin transfer torques from both of them are additive, yielding a lower switching current. As a result, the margin between recording voltage and break-down voltage is improved.

The magnetoresistive element 50 comprises: an upper electrode 30, a spin-valve layer 15, an intermediate layer 16, a recording layer 17*f*, a tunnel barrier 17*e*, a reference layer 17*d*, a coupling spacing layer 17*c*, a pinned ferromagnetic layer 17*b*, antiferromagnetic pinning layer 17*a*, a seed layer 18 and a bottom electrode 19, in the order from the top. Among them, the multi-layered structure from 17*a* to 17*f* forms a MTJ stack.

The pinned layer 17*b* is above and in contact with the antiferromagnetic ferromagnetic layer 17*a*. The ferromagnetic reference and pinned layers (17*d*, 17*b*) each have a magnetic moment vector that are usually held anti-parallel by the coupling spacer layer 17*c* and held in a fixed direction by the antiferromagnetic pinning layer. Thus the magnetic moment vector of fixed reference layer 17*d* is not free to rotate and is used as a reference. The coupling layer is typically one that exhibits the oscillatory coupling phenomenon, for example, at least one of the elements Ru, Os, Re, Cr, Rh, Cu, or their combinations, with a thickness chosen for strong anti-parallel coupling. The antiferromagnetic pinning layer, may comprise materials such as PtMn, IrMn, PdMn, or combinations thereof.

The recording layer 17*f* has a variable (reversible) magnetization having a uni-axial anisotropy parallel to the fixed magnetization of the reference layer. In another word, the MTJ stack is either at its parallel state (or the low resistance state) or anti-parallel state (or the high resistance) where no external magnetic field exists and no spin-transfer current is applied.

The spin-valve layer is made of ferromagnetic material, and has a variable (reversible) magnetization having a uniaxial anisotropy parallel to the fixed magnetization of the reference layer. The anisotropy of the spin-valve layer is smaller than that of the recording layer, which can be achieved by selecting a material having low Hc and near-zero magnetostriction and larger dimensions in the film plane, accordingly, its magnetization is readily field-switched by the bit line set/reset current pulse.

A permeable ferromagnetic material, also known also as a cladding material, may be positioned on a top portion of the bit line to focus the magnetic field on its underneath spin-valve layer. Further, the spin-valve layer easy axis may be oriented at an angle in the range of about 20 degrees to 45 degrees from the fixed magnetization direction of the reference. In a preferred embodiment of the invention, the free layer easy axis is oriented at an angle of about 90 degrees from the direction of the magnetic field generated by the bit line set/reset current pulse. It can be easily shown that for a typical free layer having a Stoner-Wohlfarth-like switching asteroid, the switching field is reduced by a factor of 2 if the field is applied at 45 degrees from the easy axis of the bit. Therefore, the current needed to set or reset the spin-valve layer magnetization direction is also reduced by a factor of 2, making the set/reset require less power, while the magnetic vector of the free layer is un-switched in the present of the bit line set/reset current.

The intermediate layer is made of a thin metal oxide, such as MgO, or the nonmagnetic metal, such as Cu, forming a thin tunneling magnetoresistance or giant magnetoresistance between the recording layer and the spin-valve layer. Accordingly, the recording layer magnetization experiences spin-transfer torques from both the reference layer and the spin-valve layer. Further, the magnetoresistance is made much smaller than that of the MTJ, yielding negligible effect on the reading signals.

Once a bit-line setting current pulse is applied, the magnetoresistive element is set in a recording mode, as shown FIG. 13A, the spin-valve layer has a magnetization anti-parallel to the magnetization direction of the reference layer, the magnetization of the recording layer is configurable, or switchable, to the direction in accordance with a direction of a recording current through the bit line into the stacked body along the stack direction to act on the recording layer by a dual spin-transfer torque from the reference layer and the spin-valve layer. Thus, the recording current voltage is reduced and a larger margin between breakdown and switching voltages is obtained.

FIG. 13B illustrates a magnetoresistive element 50 having been reset into a reading mode by applying a bit line resetting current pulse, according to the first embodiment. The field generated by the bit line resetting current switches the spin-valve layer magnetization parallel to the fixed magnetization of the reference layer and the spin-valve layer, accordingly, the magnetization of the recording layer becomes un-configurable, or un-switchable to a reading current through the bit line into the stacked body along the stack direction, due to a cancellation or partially cancellation of the two spin-transfer torques. Accordingly, the reading current voltage causes no unintended switching.

Referring now to FIGS. 14 through 20, a method of manufacturing a magnetoresistive element in an MRAM array according to the second embodiment is described. The magnetoresistive element to be manufactured by the manufacturing method according to this embodiment is the magnetoresistive element 10 of the first embodiment of FIG. 12.

Figure 14:
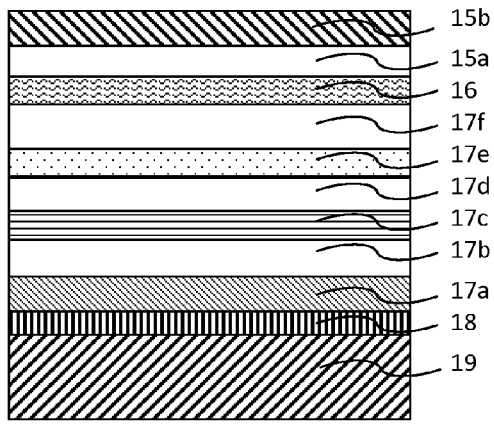
FIG. 14 is a cross-sectional view illustrating a manufacturing method according to the second embodiment.

First, as shown in FIG. 14, a magnetoresistive element including the bottom electrode 19, the seed layer 18, the antiferromagnetic layer 17*a*, the pinned layer 17*b*, the coupling spacing layer 17*c*, the reference layer 17*d*, the tunnel barrier layer 17*e*, the recording layer 17*f*, the intermediate layer 16, spin-valve layer 15*a* and the hard mask layer 15*b* is then sequentially formed to cover the contact 20 (see FIG. 12) by a sputtering technique, for example. Examples of the materials of the spin-valve layer 15*a*, the recording layer 17*f* and reference layer 17*d* are materials made of ferromagnetic material alloy consisting Co, Fe, Ni and B. The intermediate layer may be a nonmagnetic layer made of Cu, Ag, Au, or a thin metal oxide such as MgO, etc. The tunnel barrier layer 17*e* may be a magnesium oxide (MgO) layer, for example. The hard mask layer 15*b* may be a Ru/Ta (top) layer, for example.

Figure 15:
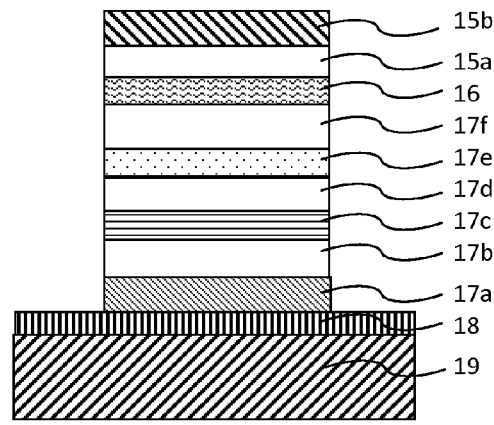
FIG. 15 is a cross-sectional view illustrating a manufacturing method according to the second embodiment.

An MTJ stack patterning is then performed by using a known lithography technique or a known etching technique. A mask (not shown) made of a photoresist is formed on the hard mask layer 15*b*. Using the mask, patterning is performed on the hard mask layer 15*b* and down to a top surface of the seed layer 18 by anisotropic etching, such as reactive ion etching (RIE), as shown in FIG. 15. Since possible re-deposition of metal atoms on the MTJ side wall could be formed, it's preferred to conduct a sputter etching at varied angle to remove these materials from tunnel barrier layer edges. An optional process includes O ion or N ion implantation into the etched surface.

Figure 16:
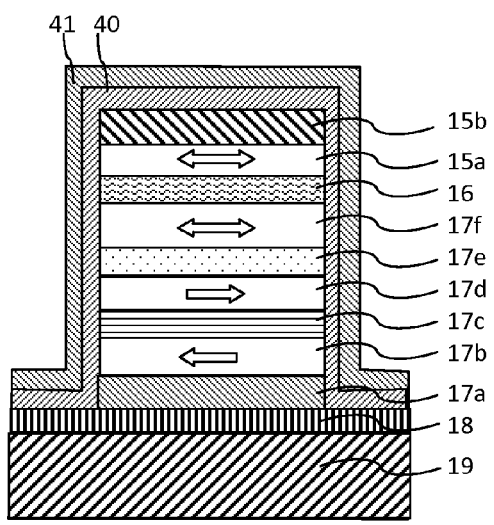
FIG. 16 is a cross-sectional view illustrating a manufacturing method according to the second embodiment.
Figure 17:
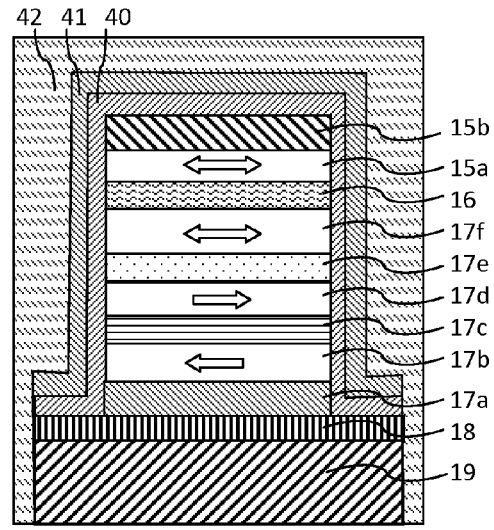
FIG. 17 is a cross-sectional view illustrating a manufacturing method according to the second embodiment.

A thin insulating film 40 is then formed to cover the surface of the patterned film. After the insulating film 40 is formed, an interlayer insulating film 41 made of silicon oxide ($SiO_2$) or silicon nitride (SiN), for example, is deposited on the entire surface, as shown in FIG. 16. A mask (not shown) made of a photoresist, for example, is formed on the flattened upper face of the interlayer insulating film 41, to electrically separates the magnetoresistive element 10 from the adjacent memory cells. Using this mask, patterning is performed on the seed layer 18 and the bottom electrode 19 by anisotropy etching. After that, an interlayer insulating film 42 is deposited to cover the interlayer insulating film 41, the insulating film 40, the bottom electrode 19, the seed layer 18 which have been subjected to the patterning, as shown in FIG. 17.

Figure 18:
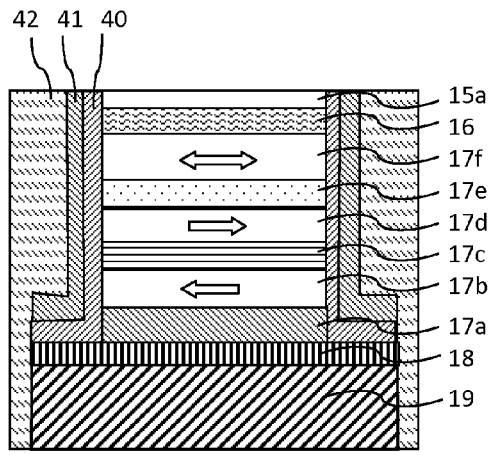
FIG. 18 is a cross-sectional view illustrating a manufacturing method according to the second embodiment.

The upper face of the interlayer insulating film 41 is then flattened by chemical mechanical polishing (CMP), followed by an IBE etching to remove the hard mask layer 15*b* and top portion of the spin-valve layer, as shown in FIG. 18.

Figure 19:
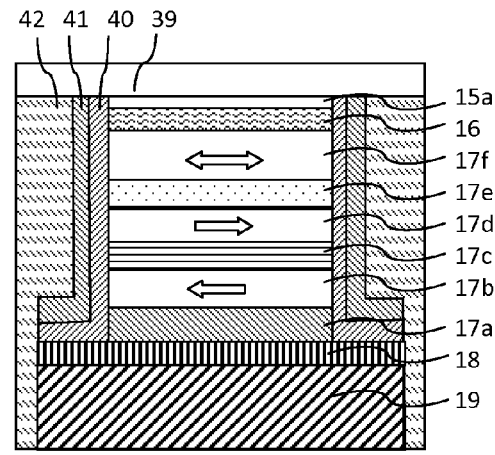
FIG. 19 is a cross-sectional view illustrating a manufacturing method according to the second embodiment.

A ferromagnetic film 39 is then deposited and combined with the remaining spin-valve layer having ferromagnetic contact to form a new spin-valve layer. The new spin-valve layer is further patterned into a shape having larger dimension than MTJ stack and aspect ratio greater than one, and this shape anisotropy mainly defines an easy axis parallel to a long axis of the spin-valve layer, as shown in FIG. 19.

Figure 20:
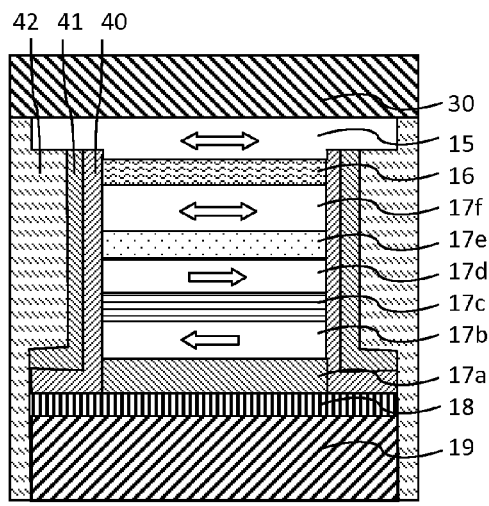
FIG. 20 is a cross-sectional view illustrating a manufacturing method according to the second embodiment.

As shown in FIG. 20, a bit line 30 to be electrically connected to the new spin-valve layer 15 on the magnetoresistive element 10. The bit line 30 may be made of aluminum (Al) or copper (Cu), for example. Thus, a memory cell of the MRAM of the first embodiment is formed by the manufacturing method according to this embodiment.

In the MRAM manufactured by the manufacturing method according to this embodiment, the spin transfer switching characteristics of magnetoresistive elements used in memory cells can be improved due to a dual spin transfer torque effect. Further, the magnetoresistive elements are manufactured with a high yield as a separated programming between recording and reading enables enhanced margins among reading, recording and breakdown voltages. Accordingly, MRAMs manufactured by the manufacturing method according to this embodiment have high productivity.

According to this embodiment, an MRAM can be formed by using magnetoresistive elements according to one of the first embodiment and its modifications.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque magnetoresistive memory comprising at least one memory cell comprising a magnetoresistive element as a memory element, and an upper and a bottom electrodes that sandwich the magnetoresistive element, a bit line coupled to the plurality of magnetoresistive memory element through the upper electrode, a CMOS transistor coupled the plurality of magnetoresistive memory element through the bottom electrode, a first circuitry coupled to the bit line and configured to apply a spin transfer current through the bit line to selected ones of the plurality of magnetoresistive memory elements, a second circuitry configured to apply a set/reset current pulse to generate a set/reset magnetic field pulse acting on the selected ones of the plurality of magnetoresistive memory elements, a magnetoresistive memory element comprising:

a recording layer having magnetic anisotropy along a first easy axis in a film plane and having a variable magnetization direction;
a reference layer having an invariable magnetization in a first direction in a film plane;
a tunnel barrier layer provided between the recording layer and the reference layer;
an intermediate layer provided on a surface of the recording layer, which is opposite to a surface of the recording layer where the tunnel barrier layer is provided;
a spin-valve layer provided on a surface of the intermediate layer having a magnetic anisotropy along a second easy axis in a film plane having a smaller magnitude than that of the recording layer, having a larger in-plane dimension than that of the recording layer and having a variable magnetization direction, having a first known magnetic stable state having a magnetization anti-parallel to or having an angle between 160 degrees and 200 degrees away from the invariable magnetization direction of the reference layer, having a second known magnetic stable state having a magnetization parallel to or having an angle between −20 degrees and +20 degrees away from the invariable magnetization direction of the reference layer.

2. The element of claim 1, wherein said intermediate layer is made of a thin metal oxide, preferred to be MgO, ZnO, MgZnO, and said spin-valve layer, intermediate layer and recording layer forms a magnetic tunnel junction having a resistance less than one third of the resistance of the magnetic tunnel junction consisting of said recording layer, tunnel barrier layer and reference layer.

3. The element of claim 1, wherein said intermediate layer is made of the nonmagnetic metal, preferred to be Cu, Ag, Au, Ru, and said spin-valve layer, intermediate layer and recording layer forms a current-perpendicular giant magnetoresistance having a resistance less than one third of the resistance of the magnetic tunnel junction consisting of said recording layer, tunnel barrier layer and reference layer.

4. The element of claim 1, wherein said spin-valve layer is a ferromagnetic alloy having at least one element selected from Co, Fe, Ni and B.

5. The element of claim 1, wherein said spin-valve layer is preferred to have an in-plane dimension 1.5 times as large as that of said recording layer and is preferred to have zero or near-zero magnetostriction.

6. The element of claim 1, wherein the anisotropy of said spin-valve layer is preferred to be equal or less than 70% of the anisotropy of said recording layer.

7. The element of claim 1, wherein said set/reset magnetic field is preferred at an angle of about 45 degrees to the first easy axis of said spin-valve layer.

8. The element of claim 1, wherein said set/reset magnetic field is preferred at an angle of 70 to 110 degrees to the first easy axis of said recording layer.

9. The element of claim 1, wherein said first direction is parallel to or has an angle between −20 and +20 degrees to the first easy axis of said recording layer.

10. The element of claim 1, wherein said set magnetic field pulse is large enough to switch the magnetization of said spin-valve layer to said first known magnetic stable state and does not switch the magnetization of said recording layer.

11. The element of claim 1, wherein said reset magnetic field pulse is large enough to switch the magnetization of said spin-valve layer to said second known magnetic stable state and does not switch the magnetization of said recording layer.

12. The element of claim 1, wherein a interconnect line of said transistor is separated by a dielectric interlayer from and underneath of said memory element.

13. The element of claim 1, wherein additional conductive lines are provided adjacent to selected ones of the plurality of magnetoresistive memory elements.

14. A method of manufacturing a magnetic memory or a magnetic memory stack film comprising:
   forming a substrate layer;
   forming a stack film on the substrate layer;
   forming a bottom electrode atop the substrate;
   forming a spin-valve magnetic layer having a variable magnetization direction in a film plane atop the bottom electrode;
   forming an intermediate layer atop the spin-valve layer;
   forming a recording magnetic layer having a variable magnetization direction in a film plane atop the intermediate layer;
   forming a tunnel barrier layer atop the recording magnetic layer;
   forming a reference magnetic layer having a fixed magnetization direction in a film plane atop the tunnel barrier layer;
   forming a coupling spacing layer atop the reference magnetic layer;
   forming a pinned magnetic layer atop the coupling spacing layer;
   forming an antiferromagnetic layer atop the pinned magnetic layer; and
   forming an upper electrode as a hard mask layer on the stack film.

15. The method of claim 14, further comprising:
   patterning on the upper electrode, the hard mask layer;
   patterning the antiferromagnetic layer;
   oxidizing residual material of the antiferromagnetic layer that is exposed to patterning;
   forming a thin insulating film and interlayer insulating layer on the patterned surface;
   performing a CMP process to flatten the upper surface of the insulating interlayer;
   forming a new hard mask layer on the surface;
   patterning the new hard mask layer and etching through the bottom electrode to form a shape having aspect ratio greater than one and to electrically separate the magnetoresistive element from the adjacent memory cells;
   performing a CMP process to expose the top surface of the upper electrode; and
   forming a bit line connected to the upper electrode.

16. A method of manufacturing a magnetic memory or a magnetic memory stack film comprising:
   forming a substrate;
   forming a bottom electrode atop the substrate;
   forming a seed layer atop the bottom electrode;
   forming an antiferromagnetic layer atop the seed layer;
   forming a pinned magnetic layer atop the antiferromagnetic layer;
   forming a coupling spacing layer atop the pinned layer;
   forming a reference magnetic layer having a fixed magnetization direction in a film plane atop the spacing layer;
   forming a tunnel barrier layer atop the reference layer;
   forming a recording magnetic layer having a variable magnetization direction in a film plane atop the tunnel barrier layer;
   forming an intermediate layer atop the recording magnetic layer;
   forming a first spin-valve magnetic layer having a variable magnetization direction in a film plane atop the recording magnetic layer; and
   forming a cap layer as a hard mask layer atop the recording layer.

17. The method of claim 16, further comprising:
   patterning the cap layer, the hard mask layer;
   patterning the antiferromagnetic layer;
   forming a thin insulating film and interlayer insulating layer on the patterned surface;
   performing a CMP process to flatten the upper surface of the insulating interlayer;
   forming a hard mask layer on the upper surface of the insulating interlayer after the CMP process;
   patterning the hard mask layer and etching through the bottom electrode to electrically separate the magnetoresistive element from the adjacent memory cells;
   performing a CMP process to expose the top surface of the cap layer;
   performing an etching to remove the cap layer and a top portion of the first spin-valve layer;
   forming a second spin-valve layer connected to the remaining first spin-valve layer;
   forming a hard mask layer on the upper surface of the second spin-valve layer;
   patterning the hard mask layer and etching the second spin-valve layer to form a shape having an aspect ratio greater than one;
   depositing a thin insulating film on the area that is exposed by the latest patterning; and
   forming a bit line connected to the spin-valve layer electrically.

* * * * *